(12) United States Patent
Fujita et al.

(10) Patent No.: US 11,587,705 B2
(45) Date of Patent: Feb. 21, 2023

(54) ELECTROMAGNETIC WAVE ABSORBING COMPOSITION AND ELECTROMAGNETIC WAVE ABSORBING BODY

(71) Applicant: Maxell, Ltd., Kyoto (JP)

(72) Inventors: Masao Fujita, Kyoto (JP); Toshio Hiroi, Kyoto (JP)

(73) Assignee: Maxell, Ltd., Kyoto (JP)

( * ) Notice: Subject to any disclaimer, the term of this patent is extended or adjusted under 35 U.S.C. 154(b) by 324 days.

(21) Appl. No.: 16/645,547

(22) PCT Filed: Sep. 12, 2018

(86) PCT No.: PCT/JP2018/033864
§ 371 (c)(1),
(2) Date: Mar. 9, 2020

(87) PCT Pub. No.: WO2019/065252
PCT Pub. Date: Apr. 4, 2019

(65) Prior Publication Data
US 2020/0265977 A1 Aug. 20, 2020

(30) Foreign Application Priority Data
Sep. 29, 2017 (JP) .............................. JP2017-191415

(51) Int. Cl.
*H01F 1/34* (2006.01)
*H01F 1/37* (2006.01)
(Continued)

(52) U.S. Cl.
CPC ............. *H01F 1/344* (2013.01); *C01G 49/06* (2013.01); *H05K 9/0083* (2013.01)

(58) Field of Classification Search
CPC . H01F 1/113; H01F 1/34; H01F 1/344; H01F 1/348; H01F 1/342; H01F 1/375;
(Continued)

(56) References Cited

U.S. PATENT DOCUMENTS 10,716,247 B2 * 7/2020 Fujita .................... B32B 27/18
11,152,711 B2 * 10/2021 Fujita .................... H01Q 17/00
(Continued)

FOREIGN PATENT DOCUMENTS

CN 101512686 A 8/2009
CN 102360673 A 2/2012
(Continued)

OTHER PUBLICATIONS

McCloy et al., "Millimeter-Wave Absorption as a Quality Control Tool for M-Type Hexaferrite Nanopowders", IEEE Transactions On Magnetics, vol. 49, No. 1, pp. 546-551. (Year: 2012).*
(Continued)

*Primary Examiner* — Matthew E. Hoban
*Assistant Examiner* — Lynne Edmondson
(74) *Attorney, Agent, or Firm* — Birch, Stewart, Kolasch & Birch, LLP (57) ABSTRACT

Provided is an electromagnetic-wave absorber composition and an electromagnetic-wave absorber that can favorably absorb a plurality of electromagnetic waves of different frequencies in a high frequency band in or above the millimeter-wave band. The electromagnetic-wave absorber composition includes a magnetic iron oxide that magnetically resonates at a high frequency in or above the millimeter-wave band and a resin binder. The electromagnetic-wave absorber composition has two or more extrema separated from each other on a differential curve obtained by differentiating a magnetic property hysteresis loop at an applied magnetic field intensity of from 16 kOe to −16 kOe. The electromagnetic-wave absorber includes an electromagnetic-wave absorbing layer formed of the above-described electromagnetic-wave absorber composition.

7 Claims, 5 Drawing Sheets

(51) Int. Cl.
*C01G 49/06* (2006.01)
*H05K 9/00* (2006.01)

(58) Field of Classification Search
CPC .. H01F 1/37; H01F 1/03; H01F 10/18; H05K 9/0083; H05K 9/0075; H05K 9/0081; H05K 9/0088; C01G 49/06
See application file for complete search history.

(56) References Cited

U.S. PATENT DOCUMENTS

| | | | |
|---|---|---|---|
| 2004/0054029 A1* | 3/2004 | Fujiki | H05K 9/0083 523/137 |
| 2010/0139971 A1 | 6/2010 | Kato et al. | |
| 2010/0238063 A1* | 9/2010 | Ohkoshi | C01G 49/0045 252/62.56 |
| 2015/0357087 A1 | 12/2015 | Sumi et al. | |

FOREIGN PATENT DOCUMENTS

| | | | |
|---|---|---|---|
| CN | 106872565 A | | 6/2017 |
| EP | 0 871 183 A1 | | 10/1998 |
| EP | 2 058 824 A1 | | 5/2009 |
| JP | 51-31890 A | | 3/1976 |
| JP | 9-115708 A | | 5/1997 |
| JP | 9-259427 A | | 10/1997 |
| JP | 10-150291 A | | 6/1998 |
| JP | 11-354972 A | | 12/1999 |
| JP | H11354972 A | * | 12/1999 |
| JP | 2000-151179 A | | 5/2000 |
| JP | 2002-280208 A | | 9/2002 |
| JP | 2003-124016 A | | 4/2003 |
| JP | 2005-347307 A | | 12/2005 |
| JP | 2006-80352 A | | 3/2006 |
| JP | 2008-60484 A | | 3/2008 |
| JP | 2008-277726 A | | 11/2008 |
| JP | 2010-135701 A | | 6/2010 |
| JP | 2011-233834 A | | 11/2011 |
| JP | 2015-15373 A | | 1/2015 |
| JP | 2015-198163 A | | 11/2015 |
| JP | 2015-232984 A | | 12/2015 |
| JP | 2017-45743 A | | 3/2017 |
| JP | 2018-110167 A | | 7/2018 |
| KR | 2002-0085615 A | | 11/2002 |
| WO | WO 98/10439 A1 | | 3/1998 |
| WO | WO 2008/120745 A1 | | 10/2008 |

OTHER PUBLICATIONS

Machine translation of JPH11354972A, 9 pages (Year: 1999).*
International Search Report, issued in PCT/JP2018/033864, PCT/ISA/210, dated Nov. 27, 2018.
Bennett et al., "Analysis of wasp-waist hysteresis loops," Journal of Applied Physics, vol. 97, 2005, 3 pages total.
Chao et al., "Microwave and millimeter wave dielectric permittivity and magnetic permeability of epsilon-gallium-iron-oxide nanopowders," Journal of Applied Physics, vol. 117, 2015, 4 pages total.
Extended European Search Report for European Application No. 18861498.6, dated Apr. 6, 2021.
González et al., "Electromagnetic Shielding Materials in GHz Range," The Chemical Record, vol. 18, 2018, pp. 1000-1009, 10 pages total.
Namai et al., "Hard magnetic ferrite with a gigantic coercivity and high frequency millimetre wave rotation," Nature Communications, Sep. 4, 2012, pp. 1-6, 6 pages total.
Primc et al., "Composite nanoplatelets combining soft-magnetic iron oxide with hard-magnetic barium hexaferrite," Nanoscale, vol. 7, 2015, pp. 2688-2697, 10 pages total.
Shukla, "Review of electromagnetic interference shielding materials fabricated by iron ingredients," Nanoscale Advances, vol. 1, 2019, pp. 1640-1671, 32 pages total.
Japanese Office Action for Japanese Application No. 2019-544555, dated May 31, 2022, with English translation.
Chinese Office Action and Search Report far Chinese Application No. 201880062572.9, dated Feb. 14, 2022, with English traaslation of Chinese Office Action.

* cited by examiner

ELECTROMAGNETIC WAVE ABSORBING COMPOSITION AND ELECTROMAGNETIC WAVE ABSORBING BODY

TECHNICAL FIELD

The present disclosure relates to an electromagnetic-wave absorbing material that absorbs electromagnetic waves, in particular, an electromagnetic-wave absorber composition and an electromagnetic-wave absorber that can absorb electromagnetic waves of a plurality of different frequencies in a frequency band between several tens of gigahertz (GHz) and several hundreds gigahertz (GHz) (called millimeter-wave band) and in a high frequency band up to three terahertz (THz).

BACKGROUND ART

Mobile communications such as mobile phones, wireless LAN and electric toll collection system (ETC) utilize electromagnetic waves called "centimeter waves" having a frequency band of several gigahertz (GHz).

As an electromagnetic-wave absorbing material for absorbing such centimeter waves, Patent Document 1 proposes a stacked sheet in which a rubber electromagnetic-wave absorbing sheet and a paper sheet material (e.g., corrugated paper) are stacked (see Patent Document 1). Patent Document 2 proposes an electromagnetic-wave absorbing sheet whose thickness is adjusted by alternately stacking thin sheets containing anisotropic graphite and a binder, so that electromagnetic-wave absorbing properties are stabilized, regardless of the incident direction of electromagnetic waves (see Patent Document 2).

Furthermore, in order to absorb electromagnetic waves in a still higher frequency band, Patent Document 3 proposes an electromagnetic-wave absorbing sheet that can absorb electromagnetic waves in a frequency band of 20 GHz or higher, by aligning the longitudinal direction of flat soft magnetic particles with the plane direction of the sheet (see Patent Document 3).

Moreover, it is known from Patent Document 4 that an electromagnetic-wave absorber that has a packing structure of particles having epsilon iron oxide ($\varepsilon$-$Fe_2O_3$) crystal in the magnetic phase, exhibits electromagnetic-wave absorbing performance in a range of 25 to 100 GHz (see Patent Document 4).

Further, Patent Document 5 proposes a noise reduction cable for reducing electromagnetic noise in a wide wave band by covering insulated electric wires with a magnetic insulating layer in which two types of magnetic powders with different frequency characteristics are mixed (see Patent Document 5).

PRIOR ART DOCUMENTS

Patent Documents

Patent Document 1: JP 2011-233834 A
Patent Document 2: JP 2006-080352 A
Patent Document 3: JP 2015-198163 A
Patent Document 4: JP 2008-060484 A
Patent Document 5: JP 2015-232984 A

DISCLOSURE OF INVENTION

Problem to be Solved by the Invention

Recently, in order to increase the capacity of transmission data, wireless communication utilizing a frequency of 60 GHz has been projected, and as vehicle-mounted radar devices utilizing extremely narrow directivity, millimeter-wave radars having frequencies of several tens of GHz or higher (millimeter-wave band from 30 GHz to 300 GHz) has proceeded. Further, researches on the technologies of utilizing electromagnetic waves having frequencies of terahertz (THz) order as electromagnetic waves in a high frequency band above the millimeter-wave band have proceeded.

However, although as electromagnetic-wave absorbing materials, which are essential in preventing the leakage of electromagnetic waves as one of the technologies utilizing electromagnetic waves, electromagnetic-wave absorbers that absorb electromagnetic waves of predetermined frequencies of about 60 GHz in the millimeter-wave band have been proposed, electromagnetic-wave absorbers that can absorb electromagnetic waves of different frequencies in a frequency band still higher than the millimeter-wave band have not yet been realized.

To solve the above conventional problem, it is an object of the present disclosure to provide an electromagnetic-wave absorber composition and an electromagnetic-wave absorber as electromagnetic-wave absorbing materials that can favorably absorb a plurality of electromagnetic waves of different frequencies in a high frequency band in or above the millimeter-wave band.

Means for Solving Problem

To solve the above problem, an electromagnetic-wave absorber composition disclosed in this application includes a magnetic iron oxide that magnetically resonates at a high frequency in or above a millimeter-wave band and a resin binder. The electromagnetic-wave absorber composition has two or more extrema separated from each other on a differential curve obtained by differentiating a magnetic property hysteresis loop at an applied magnetic field intensity of from 16 kOe to −16 kOe.

An electromagnetic-wave absorber disclosed in this application includes an electromagnetic-wave absorbing layer formed of the electromagnetic-wave absorber composition disclosed in this application.

Effects of the Invention

The electromagnetic-wave absorber composition and the electromagnetic-wave absorber disclosed in this application each include a magnetic iron oxide that magnetically resonates at a high frequency in or above the millimeter-wave band as an electromagnetic-wave absorbing substance, and have two or more extrema separated from each other on a differential curve obtained by differentiating a magnetic property hysteresis loop at an applied magnetic field intensity of from 16 kOe to −16 kOe. Therefore, it is possible to absorb electromagnetic waves of a plurality of frequencies in a high frequency band in or above several tens of GHz.

DESCRIPTION OF THE INVENTION

An electromagnetic-wave absorbing sheet of this application includes a magnetic iron oxide that magnetically resonates at a high frequency in or above the millimeter-wave band and a resin binder. The electromagnetic-wave absorber composition has two or more extrema separated from each other on a differential curve obtained by differentiating a magnetic property hysteresis loop at an applied magnetic field intensity of from 16 kOe to −16 kOe.

The electromagnetic-wave absorber composition disclosed in this application has two or more extrema separated from each other on a differential curve obtained by differentiating a magnetic property hysteresis loop at a magnetic field intensity of from 16 kOe to −16 kOe. With this configuration, the number of types of magnetic iron oxides having different coercive forces contained in the electromagnetic-wave absorber composition corresponds to the number of the extrema. Consequently, it is possible to absorb electromagnetic waves of different frequencies.

It is preferred that the coercive force of the magnetic iron oxide in the electromagnetic-wave absorber composition of this embodiment is 1200 Oe or more.

Moreover, it is preferred that the magnetic iron oxide in the electromagnetic-wave absorber composition disclosed in this application includes at least one of epsilon iron oxide, M-type ferrite, and strontium ferrite.

Further, it is preferred that the magnetic iron oxide includes at least two of epsilon iron oxide, M-type ferrite, and strontium ferrite.

An electromagnetic-wave absorber of this application includes an electromagnetic-wave absorbing layer formed of the electromagnetic-wave absorber composition disclosed in this application.

With this configuration, similarly to the electromagnetic-wave absorber composition, the electromagnetic-wave absorber disclosed in this application can favorably absorb two or more frequencies, the number of frequencies to absorb corresponding to the number of extrema on a differential curve obtained by differentiating a magnetic property hysteresis loop.

The electromagnetic-wave absorbing layer in this specification refers not only to a thin component to be stacked on another layer but also to a thick component having a function of absorbing electromagnetic waves. Therefore, the electromagnetic-wave absorber disclosed in this application includes, e.g., a molded body formed in a predetermined shape, and may be constituted only by an electromagnetic-wave absorbing layer. In the electromagnetic-wave absorber constituted only by an electromagnetic-wave absorbing layer, the magnetic iron oxide as an electromagnetic-wave absorbing substance is dispersed in the whole of the electromagnetic-wave absorber.

Moreover, it is preferred that the electromagnetic-wave absorber disclosed in this application further includes an adhesive layer.

Further, it is preferred that in the electromagnetic-wave absorber disclosed in this application, the electromagnetic-wave absorbing layer is an electromagnetic-wave absorbing sheet formed in a sheet shape.

Hereinafter, the electromagnetic-wave absorber composition and the electromagnetic-wave absorber disclosed in this application as electromagnetic-wave absorbing materials will be described with reference to the drawings.

Embodiment 1

The following describes a transmission-type electromagnetic-wave absorbing sheet constituted by an electromagnetic-wave absorbing layer that includes a particulate magnetic iron oxide and a resin binder, as an electromagnetic-wave absorber of Embodiment 1 of this application. The electromagnetic-wave absorbing sheet that is the electromagnetic-wave absorber of Embodiment 1 includes an electromagnetic-wave absorbing layer formed of an electromagnetic-wave absorber composition of this application, as will be described later.

[Sheet Configuration]

Figure 1:
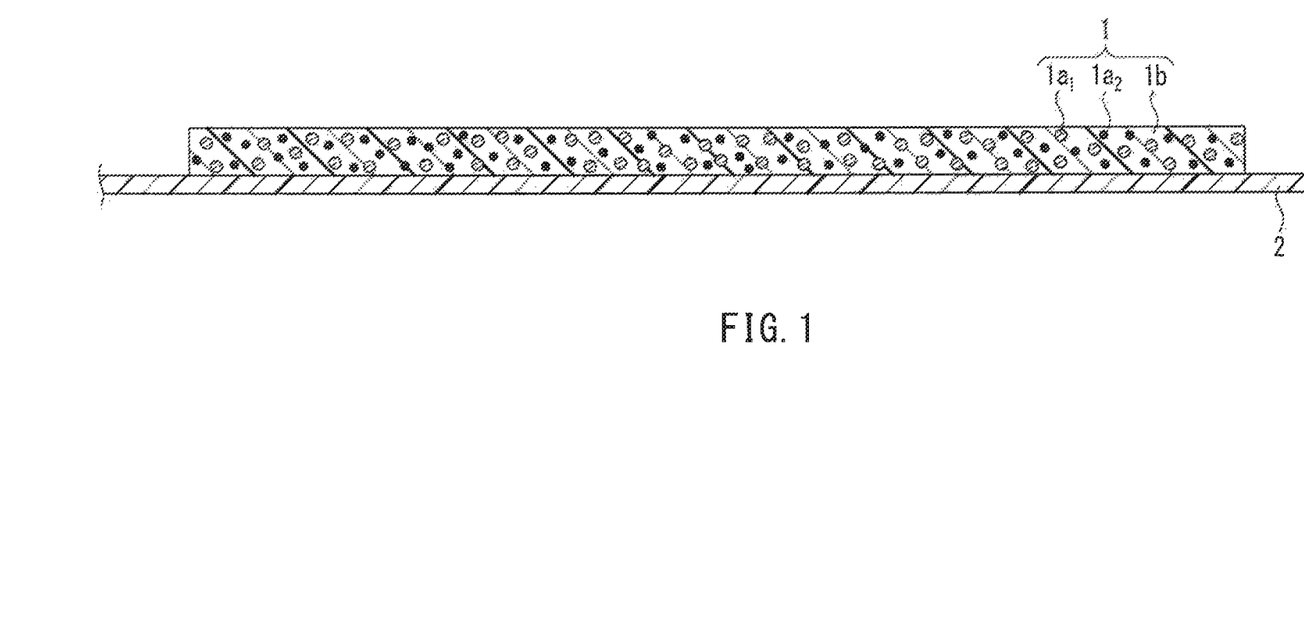
FIG. 1 is a cross-sectional view illustrating the configuration of an electromagnetic-wave absorbing sheet that is a sheet-shaped electromagnetic-wave absorber of this embodiment.

FIG. 1 is a cross-sectional view illustrating the configuration of the electromagnetic-wave absorbing sheet as the electromagnetic-wave absorber described in this embodiment.

FIG. 1 illustrates an electromagnetic-wave absorbing sheet 1 that is formed by applying an electromagnetic-wave absorbing composition to a resin sheet 2 (base) and drying the composition.

FIG. 1 is illustrated for the sake of easy understanding of the configuration of the electromagnetic-wave absorbing sheet of this embodiment, and does not faithfully reflect the actual sizes or thicknesses of members illustrated therein.

The electromagnetic-wave absorbing sheet as the electromagnetic-wave absorber exemplified in this embodiment has two extrema separated from each other on a differential curve obtained by differentiating a magnetic property hysteresis loop at an applied magnetic field intensity of from 16 kOe to −16 kOe. For this purpose, the electromagnetic-wave absorbing sheet includes an electromagnetic-wave absorbing layer 1 that contains two types of magnetic iron oxide powder $1a_1$ and $1a_2$ having different values of anisotropic magnetic fields ($H_A$) and thus having different coercive forces, and a rubber binder $1b$.

In the electromagnetic-wave absorbing sheet of this embodiment illustrated in FIG. 1, the values of the anisotropic magnetic fields ($H_A$) of the two magnetic iron oxides $1a_1$ and $1a_2$ contained in the electromagnetic-wave absorbing layer 1 differ from each other. Therefore, the coercive forces of the magnetic iron oxides $1a_1$ and $1a_2$ differ from each other. Since the magnetic iron oxides having different values of anisotropic magnetic fields ($H_A$) and thus having different coercive forces are contained in the electromagnetic-wave absorbing layer 1 as described above, it is possible to absorb electromagnetic waves of predetermined different frequencies by the magnetic iron oxides, and allow the electromagnetic-wave absorbing sheet as a whole to have electromagnetic-wave absorbing properties of forming electromagnetic-wave absorption peaks with respect to two different frequencies.

Although FIG. 1 illustrates the case in which the two types of magnetic iron oxides are contained in the electromagnetic-wave absorbing layer 1, three or more types of magnetic iron oxides may be contained in the electromagnetic-wave absorbing layer 1 in the electromagnetic-wave absorbing sheet of this embodiment, as will be described later.

In the electromagnetic-wave absorbing sheet of this embodiment, a difference in the coercive force due to a difference in the value of the anisotropic magnetic field ($H_A$) of the magnetic iron oxides contained in the electromagnetic-wave absorbing layer 1 is confirmed by the presence of peaks separated from each other on the differential curve obtained by differentiating the magnetic property hysteresis loop. This will be described later.

[Magnetic Iron Oxide]

In the electromagnetic-wave absorbing sheet of this embodiment, a particulate magnetic iron oxide is epsilon iron oxide.

The epsilon phase of epsilon iron oxide ($\varepsilon\text{-}Fe_2O_3$) is a phase that appears between the alpha phase ($\alpha\text{-}Fe_2O_3$) and the gamma phase ($\gamma\text{-}Fe_2O_3$) in ferric oxide ($Fe_2O_3$). Epsilon iron oxide is a magnetic material that can be obtained in a single phase state through a nanoparticle synthesis method that combines a reverse micelle method and a sol-gel method.

Epsilon iron oxide is fine particles of several nm to several tens of nm but has a coercive force of about 20 kOe at room temperature, which is the largest coercive force among metal oxides. Further, since the natural resonance by a gyromagnetic effect based on the precession occurs in a frequency band of several tens of GHz or higher (millimeter-wave band), epsilon iron oxide can be used as an electromagnetic-wave absorbing material that absorbs electromagnetic waves in the millimeter-wave band.

In epsilon iron oxide, by substituting part of Fe sites of the crystal with a trivalent metal element such as aluminum (Al), gallium (Ga), rhodium (Rh), or indium (In), it is possible to change a magnetic resonance frequency, i.e., a frequency of electromagnetic waves to be absorbed when epsilon iron oxide is used as an electromagnetic-wave absorbing material.

Figure 2:
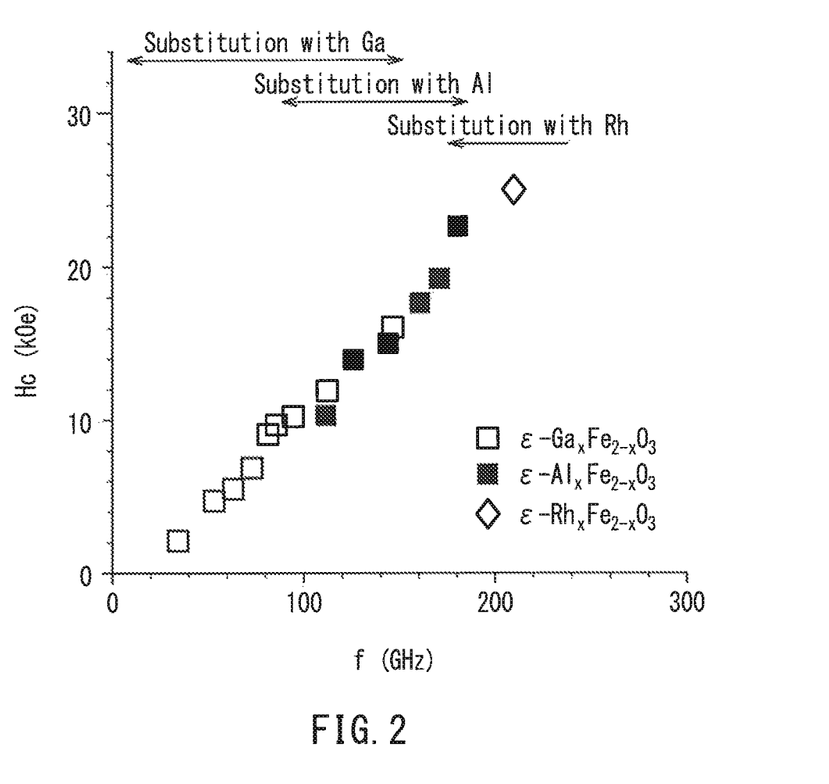
FIG. 2 is a graph illustrating electromagnetic-wave absorbing properties of epsilon iron oxide in which part of the Fe sites is substituted.

FIG. 2 illustrates a relationship between a coercive force He and a magnetic resonance frequency f of epsilon iron oxide when the metal element with which the Fe sites are substituted is changed. The magnetic resonance frequency f coincides with the frequency of electromagnetic waves to be absorbed.

FIG. 2 indicates that the magnetic resonance frequency of the epsilon iron oxide in which part of the Fe sites is substituted with a metal element varies depending on the type of the metal element and the substitution amount, and that the coercive force of the epsilon iron oxide increases with an increase in the value of the magnetic resonance frequency.

More specifically, epsilon iron oxide substituted with gallium ($\varepsilon\text{-}Ga_xFe_{2-x}O_3$) has an absorption peak in a frequency band from about 30 GHz to 150 GHz as a result of adjusting the substitution amount "x". Epsilon iron oxide substituted with aluminum ($\varepsilon\text{-}Al_xFe_{2-x}O_3$) has an absorption peak in a frequency band from about 100 GHz to 190 GHz as a result of adjusting the substitution amount "x". Therefore, the frequency of electromagnetic waves to be absorbed can be set to a desired value by selecting the type of the element with which the Fe sites of the epsilon iron oxide are substituted and adjusting the substitution amount of Fe so that the magnetic resonance frequency of the epsilon iron oxide will be a desired frequency to be absorbed by the electromagnetic-wave absorbing sheet. Further, in the case of using epsilon iron oxide substituted with rhodium ($\varepsilon\text{-}Rh_xFe_{2-x}O_3$), it is possible to shift the frequency band of electromagnetic waves to be absorbed in an even higher direction of 180 GHz or higher.

Epsilon iron oxides can be purchased, including epsilon iron oxides in which part of the Fe sites is substituted with metal. Epsilon iron oxide can be obtained as particles having an average particle diameter of about 30 nm and having a substantially spherical shape or short rod shape (bar shape).

As the magnetic iron oxide used for the electromagnetic-wave absorbing sheet of this embodiment, a magnetic iron oxide having a coercive force of 1200 Oe or more, including the above-described epsilon iron oxide can be favorably used. The magnetic iron oxide having a high coercive force of 1200 Oe or more is preferable since it is more ferromagnetic than other magnetic iron oxides and thus can absorb electromagnetic waves of high frequencies in or above the millimeter-wave band. The magnetic iron oxide having a coercive force of 1200 Oe or more may be M-type ferrite or strontium ferrite other than epsilon iron oxide exemplified above.

Attention is focused upon M-type ferrite (magneto-plumbite ferrite) because an imaginary part ($\mu r''$) of its complex permeability that relates to electromagnetic-wave absorption indicates that resonance occurs at a high frequency when a magnetic material is magnetized with the high frequency. Because the magnetic resonance frequency f is in proportional relationship with an anisotropic magnetic field ($H_A$) of a material, the value of the magnetic resonance frequency f increases in keeping with the anisotropic magnetic field ($H_A$) of the material. The magnetic resonance frequency f of M-type ferrite ($BaFe_{12}O_{19}$) is calculated to be 48 GHz from a value of its $H_A$ of 1.35 MA/m, which allows absorption of electromagnetic waves in a high GHz band. Moreover, by substituting part of $Fe^{3+}$ with $(TiMn)^{3+}$, $Al^{3+}$ or the like to regulate the value of the anisotropic magnetic field ($H_A$), it is possible to regulate the magnetic resonance frequency f to a range of 5 to 150 GHz.

Strontium ferrite is a system in which Al is added to $SrFe_{12}O_{19}$ in order to design an electromagnetic-wave absorber for a 60 GHz wireless LAN. By adding Al, a frequency exhibiting the absorption of electromagnetic waves is shifted to a higher frequency side in an electromagnetic-wave absorbing sheet. It is considered that this responds to the increase in the value of the anisotropic magnetic field ($H_A$).

By using, as a magnetic iron oxide, epsilon iron oxide, M-type ferrite, or strontium ferrite as described above, it is possible to regulate the value of the anisotropic magnetic field ($H_A$) of each magnetic iron oxide. Consequently, it is possible to change the frequency of electromagnetic waves to be absorbed in the electromagnetic-wave absorbing sheet that contains these magnetic iron oxides in the electromagnetic-wave absorbing layer 1.

[Electromagnetic-Wave absorbing Layer]

Since the magnetic iron oxide particles $1a_1$ and $1a_2$ are dispersed in the resin binder $1b$ in the electromagnetic-wave absorbing layer 1, the electromagnetic-wave absorbing sheet of this embodiment has flexibility as a sheet.

The resin binder contained in the electromagnetic wave absorbing layer 1 may be a resin material such as epoxy resin, polyester resin, polyurethane resin, acrylic resin, phenol resin, melamine resin, or rubber resin.

More specifically, examples of the epoxy resin include compounds obtained by epoxidation of hydroxyl groups at both ends of bisphenol A. Examples of the polyurethane resin include polyester urethane resin, polyether urethane resin, polycarbonate urethane resin, and epoxy urethane resin. Examples of the acrylic resin include functional group-containing methacrylic polymers obtained by copolymerization of alkyl acrylate and/or alkyl methacrylate, both of which are methacrylic resin having an alkyl group with 2 to 18 carbon atoms, and a functional group-containing monomer, and optionally other modifying monomers copolymerizable with them.

Examples of the rubber resin used as a binder include the following; styrene-based thermoplastic elastomers such as SIS (styrene-isoprene block copolymer) and SBS (styrene-butadiene block copolymer); petroleum synthetic rubber such as EPDM (ethylene-propylene-diene-rubber); and other rubber materials such as acrylic rubber and silicone rubber.

From the viewpoint of environment, it is preferable that the resin to be used as the binder does not contain halogen, i.e., halogen free. These resin materials are used in general as binder materials for resin sheets, and can be obtained easily.

The expression "flexibility" in this specification refers to a state in which the electromagnetic-wave absorbing layer can be bent to a certain degree, i.e., a state in which when the sheet is rolled up and thereafter the bent state is released, plastic deformation such as breakage does not occur, and the sheet returns to a flat state.

The electromagnetic-wave absorbing layer of the electromagnetic-wave absorbing sheet of this embodiment contains epsilon iron oxide as an electromagnetic-wave absorbing material. Since epsilon iron oxide is fine nanoparticles having a particle diameter of several nm to several tens of nm as described above, it is important to favorably disperse the nanoparticles in the binder during the formation of the electromagnetic-wave absorbing layer. For this reason, the electromagnetic-wave absorbing layer contains a phosphate compound, examples of which include; arylsulfonic acids such as phenylphosphonic acid and phenylphosphonic dichloride; alkylphosphonic acids such as methylphosphonic acid, ethylphosphonic acid, octylphosphonic acid, propylphosphonic acid; and polyfunctional phosphoric acids such as hydroxyethanediphosphonic acid, nitrotris methylene phosphoric acid. These phosphate compounds are flame-retardant and function as dispersants for fine magnetic iron oxide powder, thereby favorably dispersing epsilon iron oxide particles in the binder.

More specifically, as the dispersant, phenylphosphonic acid (PPA) manufactured by FUJIFILM Wako Pure Chemical Corporation or Nissan Chemical Corporation and oxidized phosphoric acid ester "JP-502" (trade name) manufactured by JOHOKU CHEMICAL CO., LTD., can be used.

In one example, the composition of the electromagnetic-wave absorbing layer may be 2 to 50 parts of the resin binder and 0.1 to 15 parts of the phosphate compound based on 100 parts of epsilon iron oxide powder. If the content of the resin binder is less than 2 parts, the magnetic iron oxide cannot be dispersed favorably, and the shape of a magnetic layer cannot be maintained as a sheet. If the content of the resin binder exceeds 50 parts, the volume content of the magnetic iron oxide in the electromagnetic-wave absorbing layer is lowered and the permeability decreases, which lessens the electromagnetic-wave absorption effects.

If the content of the phosphate compound is less than 0.1 parts, the magnetic iron oxide cannot be well dispersed in the resin binder. If the content of the phosphate compound is more than 15 parts, the effect of adequately dispersing the magnetic iron oxide becomes saturated. The volume content of the magnetic iron oxide in the electromagnetic-wave absorbing layer is lowered and the permeability decreases, which lessens the electromagnetic-wave absorption effects.

[Method for Producing Electromagnetic-Wave Absorbing Sheet]

The following describes an example of a method for producing the electromagnetic-wave absorbing sheet of this embodiment.

The electromagnetic-wave absorbing sheet of this embodiment is produced, e.g., by preparing a magnetic coating material that is an electromagnetic-wave absorber composition that includes at least magnetic iron oxide powder and a resin binder, and applying the magnetic coating material in a predetermined thickness, followed by drying and calendering.

The magnetic coating material can be obtained by mixing at high speed at least magnetic iron oxide powder, a phosphate compound (dispersant) and a resin binder as magnetic coating material components with a high-speed stirrer to prepare a mixture, and dispersing the obtained mixture with a sand mill.

An electromagnetic-wave absorbing sheet is produced using the magnetic coating material (electromagnetic-wave absorber composition) thus prepared.

In the production of the electromagnetic-wave absorbing sheet, the magnetic coating material is applied to the resin sheet 2 as illustrated in FIG. 1. The resin sheet 2 may be, e.g., a 38 μm-thick polyethylene terephthalate (PET) sheet that has been subjected to a peeling treatment by silicone coating. The magnetic coating material is applied to the resin sheet 2 using an application method such as a table coater method or a bar coater method.

The wet magnetic coating material is dried and calendered to form an electromagnetic-wave absorbing sheet on a support. The thickness of the electromagnetic-wave absorbing sheet can be controlled by the coating thickness, the calendering conditions, and the like. The calendered electromagnetic-wave absorbing sheet 1 is peeled off from the resin sheet 2 to obtain an electromagnetic-wave absorbing sheet 1 having a desired thickness.

The calendering may be performed as needed, and may not be performed when the volume content of the magnetic iron oxide powder falls within a predetermined range in a state in which the magnetic coating material has been dried.

[Base Film, Adhesive Layer]

In the electromagnetic-wave absorbing sheet of this embodiment, the electromagnetic-wave absorbing layer 1 is formed on a base film (not illustrated).

If the formed electromagnetic-wave absorbing layer 1 is thin, and the electromagnetic-wave absorbing sheet 1 cannot obtain a predetermined strength, it is preferable that a base film that is a resin base is stacked on the back surface side of the electromagnetic-wave absorbing layer 1.

The base film may be formed using various resin films such as a PET film, rubbers, and paper materials such as Japanese paper. The material and the thickness of the base film do not affect the electromagnetic-wave absorbing properties in the electromagnetic-wave absorbing sheet of this embodiment. Thus, it is possible to select a base film that is made from an appropriate material and that has an appropriate thickness from the viewpoint of the practical use (e.g., strength, handleability) of the electromagnetic-wave absorbing sheet.

Further, the electromagnetic-wave absorbing sheet of this embodiment can include an adhesive layer (not illustrated) on the back surface side of the electromagnetic-wave absorbing layer 1 or the surface of the base film on a side opposite to a side where the electromagnetic-wave absorbing layer 1 is formed.

By providing the adhesive layer, it is possible to easily attach the electromagnetic-wave absorbing sheet constituted by the electromagnetic-wave absorbing layer 1 to a desired position, including an inner surface of a housing that contains an electric circuit and an inner surface or outer surface of an electric device regardless of the presence or absence of the base film. Specifically, since the electromagnetic-wave absorbing layer 1 of the electromagnetic-wave absorbing sheet of this embodiment has flexibility, the sheet can be attached easily even on a curved surface (bent surface), which improves the handleability of the electromagnetic-wave absorbing sheet.

The adhesive layer may be formed using a known material generally used as an adhesive layer such as an adhesive tape, and examples of which include an acrylic adhesive, a rubber adhesive, and a silicone adhesive. A tackifier or crosslinking agent may be used to adjust the tackiness with respect to an adherend and reduce adhesive residues. The tackiness with respect to an adherend is preferably 5 N/10 mm to 12 N/10 mm. If the tackiness is smaller than 5 N/10 mm, the electromagnetic-wave absorbing sheet may be easily peeled off or displaced from an adherend. If the tackiness is larger than 12 N/10 mm, the electromagnetic-wave absorbing sheet is difficult to be peeled off from an adherend.

The thickness of the adhesive layer is preferably 20 µm to 100 µm. When the adhesive layer is thinner than 20 µm, the tackiness is low and the electromagnetic-wave absorbing sheet may be easily peeled off or displaced from an adherend. When the adhesive layer 4 is thicker than 100 µm, the electromagnetic-wave absorbing sheet is difficult to be peeled off from an adherend. If cohesion of the adhesive layer is low, an adhesive may remain on an adherend when the electromagnetic-wave absorbing sheet is peeled off from the adherend.

The adhesive layer in this specification may be an adhesive layer for unpeelable attachment, or an adhesive layer for peelable attachment.

Moreover, needless to say, it is not essential for the electromagnetic-wave absorbing sheet to include the adhesive layer for attachment of the electromagnetic-wave absorbing sheet to a predetermined surface. Instead, the surface of a member on which the electromagnetic-wave absorbing sheet is to be disposed may have tackiness, or a double-sided tape or an adhesive may be used to attach the electromagnetic-wave absorbing sheet to a predetermined part. In this regard, the adhesive layer is not an essential component in the electromagnetic-wave absorbing sheet of this embodiment.

The method for forming the electromagnetic-wave absorbing sheet as the electromagnetic-wave absorber may be a method including: preparing a magnetic compound containing magnetic iron oxide powder and a rubber binder; and subjecting the magnetic compound to molding into a predetermined thickness and crosslinking, other than the above-described method including stacking the electromagnetic-wave absorbing layer 1 on the base film that is a resin base.

In the case of this method, first, a magnetic compound is prepared. The magnetic compound can be obtained by mixing and kneading epsilon iron oxide powder, a dispersant, and a rubber resin. In one example, the kneaded mixture can be obtained by mixing and kneading the materials with a pressurized batch-type kneader. At this time, a crosslinking agent may be blended as needed.

In one example, the magnetic compound thus obtained is subjected to crosslinking and molding into a sheet at a temperature of 150° C. with a hydraulic pressing machine.

Then, the sheet is subjected to secondary crosslinking in a thermostat at 170° C. Thus, the electromagnetic-wave absorbing layer 1 can be formed.

An adhesive layer can be formed on the back surface side of the electromagnetic-wave absorbing layer 1 thus formed, in the same manner as the above-described electromagnetic-wave absorbing sheet of this embodiment.

[Hysteresis Loop and Differential Curve Obtained by Differentiating Loop]

Figure 3:
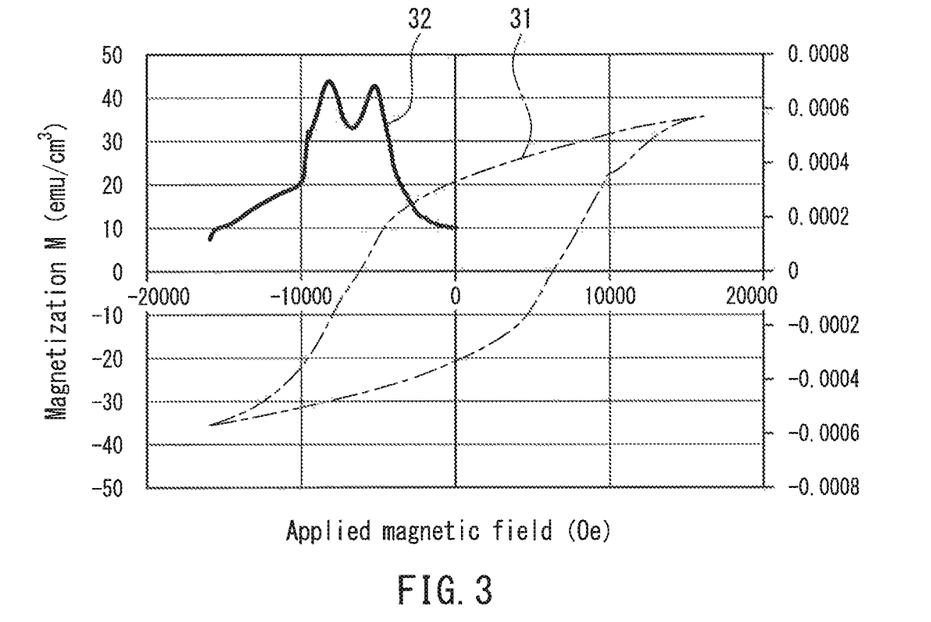
FIG. 3 is a graph illustrating a magnetic property hysteresis loop of a first configuration example of an electromagnetic-wave absorbing layer constituting an electromagnetic-wave absorbing sheet of this embodiment and a differential curve obtained by differentiating the loop.

FIG. 3 is a graph illustrating a magnetic property hysteresis loop of a first configuration example of the electromagnetic-wave absorbing layer of the electromagnetic-wave absorbing sheet of this embodiment and a differential curve obtained by differentiating the loop.

A hysteresis loop illustrated in each of the following figures was measured as below. A sample was prepared to contain a predetermined magnetic iron oxide and have a diameter of 8 mmφ and a thickness of 2 mm. A vibrating sample magnetometer VSM-P (trade name) manufactured by Toei Industry Co., Ltd was used to perform a measurement in an applied magnetic field in a range of from 16 kOe to −16 kOe. A time constant Tc for the measurement was 0.03 sec.

As illustrated in FIG. 3, a magnetization curve 31, which indicates the intensity of magnetization remaining in the magnetic iron oxide upon application of the magnetic field whose intensity was changed from the outside, shows a hysteresis loop.

The value of the anisotropic magnetic field ($H_A$) and the magnetic resonance frequency fr of a magnetic material has a relationship expressed by Formula (1) below.

$$fr = v/2\pi * H_A \qquad (1)$$

Here, v is a gyromagnetic constant determined by the type of the magnetic material.

Thus, the value of the anisotropic magnetic field ($H_A$) and the magnetic resonance frequency fr has a proportional relationship in a gyromagnetic resonant-type magnetic material.

The electromagnetic-wave absorber composition disclosed in this application and the electromagnetic-wave absorbing layer of the electromagnetic-wave absorber disclosed in this application produced by using the composition have two or more extrema separated from each other on a differential curve obtained by differentiating a magnetic property hysteresis loop at a magnetic field intensity of from 16 kOe to −16 kOe. Because the anisotropic magnetic field ($H_A$) of a magnetic iron oxide is proportional to an anisotropic constant (Ku), and the anisotropic constant (Ku) is proportional to a coercive force (Hc), the two or more different polarities on the differential curve obtained by differentiating the magnetic property hysteresis loop indicate that the electromagnetic-wave absorber composition disclosed in this application and the electromagnetic-wave absorbing layer of the electromagnetic-wave absorber disclosed in this application include two or more magnetic iron oxides that have different coercive forces (Hc). Since the magnetic iron oxides have different coercive forces (Hc) and thus have different anisotropic magnetic fields ($H_A$), and the value of the anisotropic magnetic field ($H_A$) and the magnetic resonance frequency fr have a proportional relationship as indicated by the above-described formula (1), different values of the anisotropic magnetic fields ($H_A$) yield different magnetic resonance frequencies fr. Consequently, the electromagnetic-wave absorber composition disclosed in this application and the electromagnetic-wave absorber that includes the electromagnetic-wave absorbing layer produced by using the composition can absorb electromagnetic waves of two or more frequencies, the number of frequencies to absorb corresponding to the number of the extrema.

Since the electromagnetic-wave absorbing layer 1 of the electromagnetic-wave absorbing sheet of this embodiment similarly contains a plurality of magnetic iron oxides having different values of anisotropic magnetic fields ($H_A$), i.e., having different coercive forces, magnetic resonance occurs at different frequencies, which converts electromagnetic waves of these frequencies into heat to attenuate the electromagnetic waves. Consequently, the electromagnetic-wave absorbing sheet of this embodiment can absorb electromagnetic waves of different predetermined frequencies by the magnetic iron oxides contained in the electromagnetic-wave absorbing layer, i.e., electromagnetic waves of a plurality of frequencies, the number of frequencies to absorb corresponding to the number of the extrema of the differential curve obtained by differentiating the hysteresis loop.

It is possible to easily determine whether or not a plurality of magnetic iron oxides having different values of anisotropic magnetic fields ($H_A$) are contained in the electromagnetic-wave absorbing layer 1, by depicting a differential curve 32 obtained by differentiating the hysteresis curve 31.

In the example illustrated in FIG. 3, an epsilon iron oxide having an electromagnetic-wave shielding frequency (magnetic resonance frequency) of 60 GHz and an epsilon iron oxide having an electromagnetic-wave shielding frequency (magnetic resonance frequency) of 79 GHz were mixed at a ratio of 1:1 to prepare a magnetic coating material in the following proportion.

Magnetic iron oxide powder:epsilon iron oxide (60 GHz): epsilon iron oxide (79 GHz)=1:1
  100 parts
  Dispersant: DISPERBYK-142 (trade name) 15 parts
  Solvent: methyl ethyl ketone/toluene (=1/1 mixed solvent) 95 parts The magnetic coating material components were dispersed with a 2 L disc sand mill using zirconia beads having a diameter of 0.5 mm as a dispersing medium. While stirring the dispersed coating material with a stirrer, materials below were blended and dispersed under the same conditions as those described in the above method for producing the electromagnetic-wave absorbing sheet to obtain a magnetic coating material.

Magnetic coating material component 100 parts
  Polyurethane binder: (VYLON UR 8700 (trade name)) 46 parts
  Solvent (diluted): Methyl ethyl ketone/toluene (=1/1 mixed solvent) 120 parts Subsequently, the magnetic coating material thus obtained was applied with a bar coater to a 38 μm-thick polyethylene terephthalate (PET) sheet that had been subjected to a peeling treatment by silicone coating. The wet composition was dried at 80° C. for 1440 minutes to obtain a sheet having a thickness of 400 μm.

The sheet thus obtained was calendered at 80° C. at a pressure of 150 kg/cm to produce an electromagnetic-wave absorbing sheet having a thickness of 300 μm.

Regarding the electromagnetic-wave absorbing sheet, the differential curve 32 of the hysteresis curve 31 shows two peaks as illustrated in FIG. 3. Since the measured sample has two different values of anisotropic magnetic fields ($H_A$), it is confirmed that the sample contains two types of magnetic iron oxides having different coercive amounts.

Figure 4:
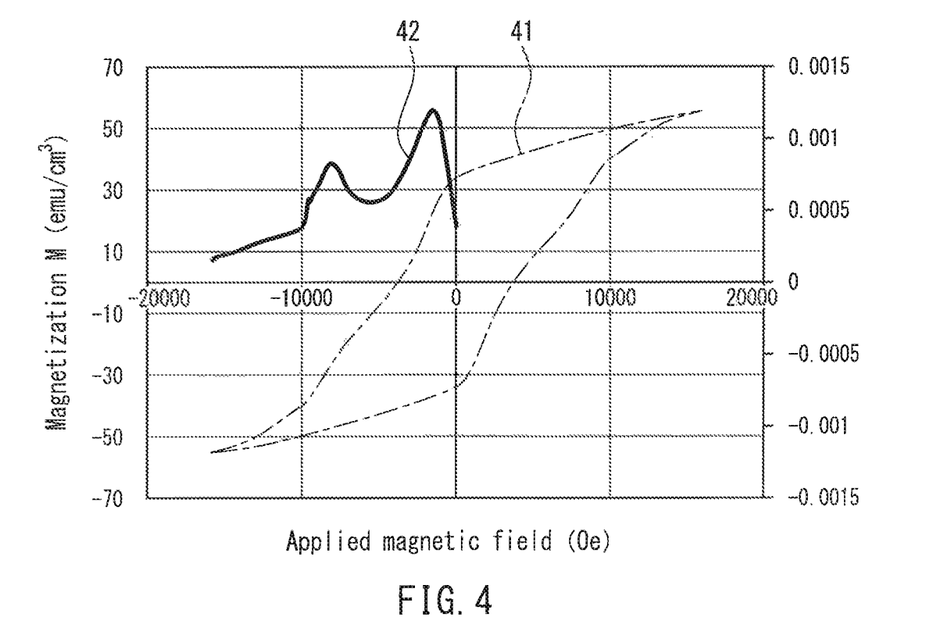
FIG. 4 is a graph illustrating a magnetic property hysteresis loop of a second configuration example of the electromagnetic-wave absorbing layer constituting the electromagnetic-wave absorbing sheet of this embodiment and a differential curve obtained by differentiating the loop.

FIG. 4 is a graph illustrating a magnetic property hysteresis loop of a second configuration example of the electromagnetic-wave absorbing layer of the electromagnetic-wave absorbing sheet of this embodiment and a differential curve obtained by differentiating the loop.

In FIG. 4, a magnetic coating material in which strontium ferrite having an electromagnetic-wave shielding frequency (magnetic resonance frequency) of 79 GHz and epsilon iron oxide having an electromagnetic-wave shielding frequency (magnetic resonance frequency) of 79 GHz as magnetic iron oxides were mixed at a ratio of about 1:1 was used to prepare an electromagnetic-wave absorbing sheet.

When the magnetic iron oxides differ in type but have the same electromagnetic-wave shielding frequency, gyromagnetic constants differ depending on a material, and thus different coercive forces differ from each other as illustrated in FIG. 4. Therefore, it is clear that a differential curve 42 of a hysteresis loop 41 has two peaks. It can be considered that this results from a relationship of anisotropic magnetic field ($H_A$)=2×anisotropic constant/magnetization since there is a relationship of coercive force=anisotropic constant/magnetization, i.e., anisotropic constant=coercive force×magnetization.

Figure 5:
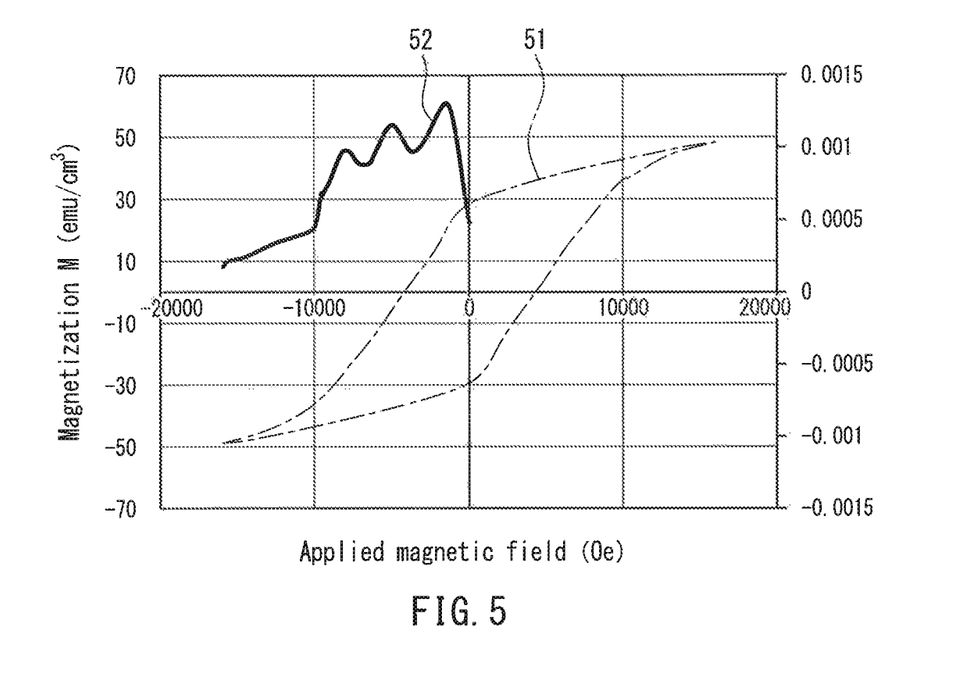
FIG. 5 is a graph illustrating a magnetic property hysteresis loop of a third configuration example of the electromagnetic-wave absorbing layer constituting the electromagnetic-wave absorbing sheet of this embodiment and a differential curve obtained by differentiating the loop.

FIG. 5 is a graph illustrating a magnetic property hysteresis loop of a third configuration example of the electromagnetic-wave absorbing layer of the electromagnetic-wave absorbing sheet of this embodiment and a differential curve obtained by differentiating the loop.

The third configuration example contains three types of magnetic iron oxides having different coercive forces. Specifically, the three types of magnetic iron oxides are strontium ferrite having an electromagnetic-wave shielding frequency (magnetic resonance frequency) of 79 GHz and epsilon iron oxide having an electromagnetic-wave shielding frequency (magnetic resonance frequency) of 79 GHz described above, and epsilon iron oxide having an electromagnetic-wave shielding frequency (magnetic resonance frequency) of 60 GHz. A magnetic coating material containing the three types of magnetic iron oxides mixed at a ratio of about 1:1:1 was used to prepare an electromagnetic-wave absorbing sheet.

When the three types of magnetic iron oxides having different values of anisotropic magnetic fields ($H_A$) and thus having different values of coercive forces are contained, a differential curve 52 of a hysteresis loop 51 has three peaks as illustrated in FIG. 5.

Next, it was confirmed what degree of the difference between the electromagnetic-wave shielding frequencies (magnetic resonance frequencies) of magnetic iron oxides contained in an electromagnetic-wave absorbing layer causes different peaks on a differential curve of a hysteresis loop.

Figure 6:
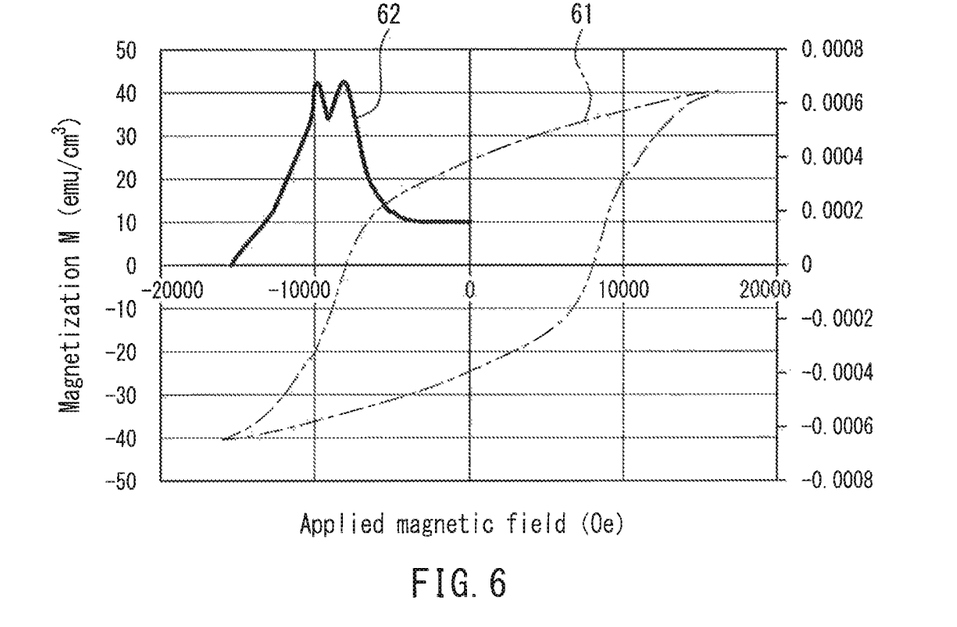
FIG. 6 is a graph illustrating a magnetic property hysteresis loop of a fourth configuration example of the electromagnetic-wave absorbing layer constituting the electromagnetic-wave absorbing sheet of this embodiment and a differential curve obtained by differentiating the loop.

FIG. 6 is a graph illustrating a magnetic property hysteresis loop of a fourth configuration example of the electromagnetic-wave absorbing layer of the electromagnetic-wave absorbing absorbing sheet of this embodiment and a differential curve obtained by differentiating the loop.

Figure 7:
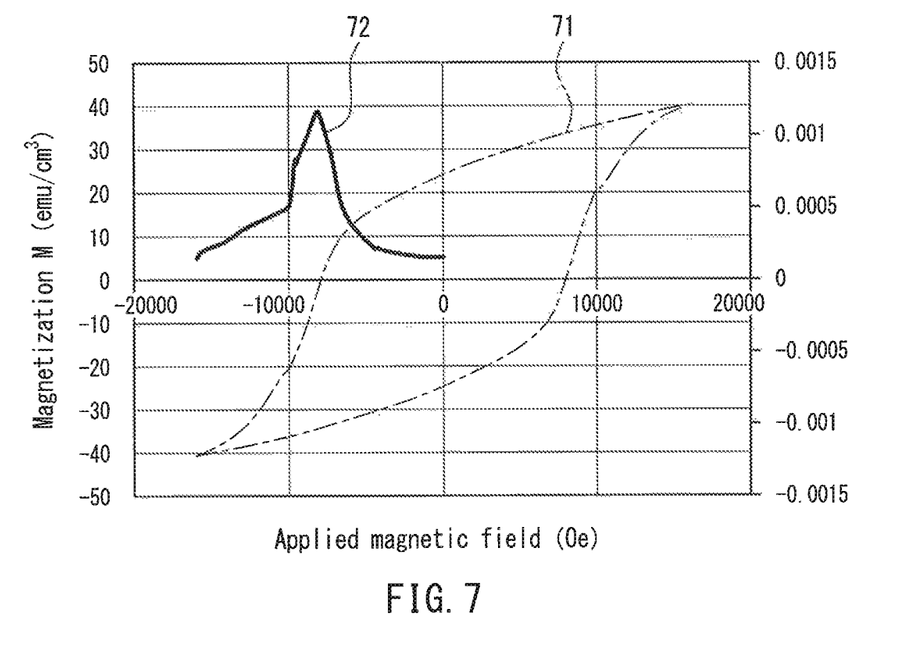
FIG. 7 is a graph illustrating a magnetic property hysteresis loop of an electromagnetic-wave absorbing layer in an electromagnetic-wave absorbing sheet of a Comparative Example and a differential curve obtained by differentiating the loop.

FIG. 7 illustrates a magnetic property hysteresis loop of an electromagnetic-wave absorbing layer of a Comparative Example and a differential curve obtained by differentiating the loop.

In FIG. 6, a sample measured was an electromagnetic-wave absorbing layer produced using a magnetic coating material that contains an epsilon iron oxide having an electromagnetic-wave shielding frequency (magnetic resonance frequency) of 74 GHz and an epsilon iron oxide having an electromagnetic-wave shielding frequency (magnetic resonance frequency) of 79 GHz. In FIG. 7, a sample measured was an electromagnetic-wave absorbing layer produced using a magnetic coating material that contains an epsilon iron oxide having an electromagnetic-wave shielding frequency (magnetic resonance frequency) of 76 GHz and an epsilon iron oxide having an electromagnetic-wave shielding frequency (magnetic resonance frequency) of 79 GHz. In both cases, the magnetic iron oxides were mixed at a ratio of about 1:1.

Two different peaks can be confirmed on a differential curve 62 of a hysteresis loop 61 in FIG. 6. However, only one peak can be confirmed on a differential curve 72 of a hysteresis loop 71 in FIG. 7, which probably peaks overlap each other.

In view of the above, it is considered from Formula (1) that when gyromagnetic constants ν are the same, i.e., materials are the same, a difference of 5 GHz or more is needed between the electromagnetic-wave shielding frequencies (maximum absorption frequencies, i.e., magnetic resonance frequencies) of the magnetic iron oxides contained in the electromagnetic-wave absorbing layer to confirm two different peaks on a differential curve of a hysteresis loop. In other words, if the same type of magnetic iron oxides are contained in the electromagnetic-wave absorber composition, the electromagnetic-wave absorbing layer of the electromagnetic-wave absorber disclosed in this application, it is preferred that there is a difference of 5 GHz or more between the maximum absorption frequencies of the magnetic iron oxides. Consequently, it is easy to have extrema clearly separated from each other. In contrast to this, if there is a difference of less than 5 GHz between the maximum absorption frequencies of the magnetic iron oxides, it is difficult to have a plurality of extrema clearly separated from each other on a differential curve of a hysteresis loop.

If only one peak can be confirmed on a differential curve of a hysteresis loop as illustrated in FIG. 7, this means that two or more different frequencies cannot be absorbed.

As described above, the electromagnetic-wave absorbing sheet of this embodiment absorbs electromagnetic waves of the same frequencies as the electromagnetic-wave shielding frequencies (magnetic resonance frequencies) of its magnetic iron oxides by the magnetic resonance of the magnetic iron oxides.

Thus, since a differential curve of a hysteresis loop of an electromagnetic-wave absorbing substance that constitutes the electromagnetic-wave absorbing layer has two or more extrema separated from each other, it is possible to provide an electromagnetic-wave absorbing sheet that can absorb electromagnetic waves of different frequencies.

The inventors' studies have clearly confirmed that when orientation degrees of the magnetic iron oxides having different values of anisotropic magnetic fields ($H_A$) and thus having different coercive forces contained in the electromagnetic-wave absorbing layer differ from each other, a differential curve of a hysteresis loop has two different extrema although the curve has different half-widths of peaks and different heights of the extrema that are the peaks.

Moreover, it has been found that when blend ratios of the magnetic iron oxides having different values of anisotropic magnetic fields ($H_A$) and thus having different coercive forces differ from each other, a differential curve of a hysteresis loop has almost the same half-widths but has different heights of peaks that are extrema. Further, when particle size distributions of the magnetic iron oxides having different values of anisotropic magnetic fields ($H_A$) and thus having different coercive forces differ from each other, a differential curve of a hysteresis loop has almost the same half-widths but has different heights of peaks that are extrema. However, in any of these cases, it is clearly confirmed that the extrema of the differential curves are two and separated from each other.

It is possible to confirm that the magnetic iron oxides contained in the electromagnetic-wave absorbing layer in the electromagnetic-wave absorbing sheet of this embodiment have different values of anisotropic magnetic fields ($H_A$) and thus have different coercive forces by the presence of two or more different extrema separated from each other on a differential curve of a magnetic property hysteresis loop as described above. Moreover, when the magnetic iron oxides differ in type, it is possible to confirm that different gyromagnetic constants yield different coercive forces by the presence of two or more different extrema separated from each other on a differential curve of a magnetic property hysteresis loop.

Further, the electromagnetic-wave absorbing sheet of this embodiment can favorably absorb electromagnetic waves of electromagnetic-wave shielding frequencies (magnetic resonance frequencies) that correspond to the values of the anisotropic magnetic fields ($H_A$) of the magnetic iron oxides contained in the electromagnetic-wave absorbing layer.

In the above examples, two or more magnetic iron oxides having different values of anisotropic magnetic fields ($H_A$) and thus having coercive forces are contained in one electromagnetic-wave absorbing layer. However, the electromagnetic-wave absorber disclosed in this application includes a configuration in which two or more layers that contain magnetic iron oxides that have different values of anisotropic magnetic fields ($H_A$) are stacked. Such an electromagnetic-wave absorber, in which two or more layers that contain magnetic iron oxides that have different values of anisotropic magnetic fields ($H_A$) are stacked, also results in two or more different extrema separated from each other appearing on a differential curve of a magnetic property hysteresis loop, and absorbs electromagnetic waves of electromagnetic-wave shielding frequencies (magnetic resonance frequencies) that correspond to the values of the anisotropic magnetic fields ($H_A$) of the magnetic iron oxides.

Moreover, Embodiment 1 exemplifies, as an electromagnetic-wave absorber, a sheet-shaped electromagnetic-wave absorbing layer, i.e., an electromagnetic-wave absorbing sheet whose thickness in the perpendicular direction when viewing its principal surface in plan view is extremely smaller than the size of a side of the principal surface and that is entirely small in the thickness direction. However, the electromagnetic-wave absorber disclosed in this application is not limited to such a sheet shape and may be formed as an electromagnetic-wave absorber (molded body) that includes a block-shaped electromagnetic-wave absorbing layer having a thickness of a certain size equal to or larger than the size of the principal surface or that is constituted by such an electromagnetic-wave absorbing layer itself.

In this case, the shape of the electromagnetic-wave absorber is not limited to a rectangular prism shape including a cuboid shape. Various shapes including solid shapes such as a cylinder shape, a sphere, and other irregular shapes and including hollow shapes such as a corn shape, a tray shape, and a frame shape may be acted on as required according to the usage conditions of the absorber.

Needless to say, the above-described electromagnetic-wave absorbers in various shapes may further include an adhesive layer to be easily attachable to a predetermined location.

Embodiment 2

The following describes an electromagnetic-wave absorber composition as an electromagnetic-wave absorbing member of this application.

The electromagnetic-wave absorber composition exemplified as Embodiment 2 is the magnetic coating material used to produce the electromagnetic-wave absorbing layer of the electromagnetic-wave absorbing sheet described in Embodiment 1, as described above.

Because the magnetic coating material contains a plurality of magnetic oxides having different predetermined values of anisotropic magnetic fields ($H_A$) and thus having different coercive forces in a resin binder, the magnetic coating material itself and as a material for forming a solid electromagnetic-wave absorber hardened in a bulk shape has the same electromagnetic-wave absorbing properties as those of the above-described electromagnetic-wave absorbing sheet. Similarly to the case of the above-described electromagnetic-wave absorber, it is preferable that the coercive forces of a plurality of magnetic iron oxides contained in the electromagnetic-wave absorber composition are 1200 Oe or more.

For example, a magnetic coating material as an electromagnetic-wave absorber composition including magnetic iron oxide particles and a resin binder is used to impart electromagnetic-wave absorbing properties to a member having a complicated surface shape or a broad portion of a wall or a ceiling. Moreover, it is possible to mold the magnetic coating material directly on an IC chip that generates electromagnetic waves. Consequently, it is possible to shield the whole of a complicated-shaped device that generates electromagnetic waves. Further, it is possible to shield the whole of a room from electromagnetic waves of a plurality of frequencies.

Exemplary methods for applying the electromagnetic-wave absorber composition disclosed in this application on a member having a complicated surface shape or a broad portion of a wall or a ceiling include a method by applying the composition on a surface with a brush or the like and a method by spraying the composition with a spray.

Also in this case, the frequencies of electromagnetic waves to be absorbed in the electromagnetic-wave absorber composition correspond to the values of the anisotropic magnetic fields ($H_A$) of the contained magnetic oxides.

The electromagnetic-wave absorber composition can function as a member for absorbing electromagnetic waves of predetermined frequencies and also function as a filter for selectively passing electromagnetic waves of frequencies other than portions of extrema on a differential curve.

Since the electromagnetic-wave absorber composition and the electromagnetic-wave absorber disclosed in this application have two or more extrema separated from each other on a differential curve obtained by differentiating a magnetic property hysteresis loop obtained by applying an external magnetic field, it is confirmed that the composition and the absorber include a plurality of magnetic iron oxides having different values of anisotropic magnetic fields ($H_A$) and thus having different coercive forces as described above, whereby it is possible to favorably use an electromagnetic-wave absorber that absorbs electromagnetic waves of two or more frequencies, the number of frequencies to absorb corresponding to the number of extrema on a differential curve.

The reason why the intensity of an external magnetic field for measuring a hysteresis loop is set to a range of from 16 kOe to −16 kOe is that a favorable hysteresis loop is obtained by applying an external magnetic field within this range. There is no problem even if the absolute value of the intensity of the external magnetic field to be applied is larger than 16 kOe. The differential curve may be obtained by measuring the hysteresis loop in the external magnetic field intensity from 16 kOe to −16 kOe.

INDUSTRIAL APPLICABILITY

The electromagnetic-wave absorber composition and the electromagnetic-wave absorber disclosed in this application are useful as electromagnetic-wave absorbing materials that absorb electromagnetic waves of a plurality of, i.e., two or more frequencies in a high frequency in or above the millimeter-wave band.

DESCRIPTION OF REFERENCE NUMERALS

1 Electromagnetic-wave absorbing layer
1a (1a₁, 1a₂) Magnetic iron oxide particle
1b Resin binder

The invention claimed is:

1. An electromagnetic-wave absorber composition, comprising:
   a magnetic iron oxide that magnetically resonates at a high frequency in or above a millimeter-wave band; and
   a resin binder,
   wherein the magnetic iron oxide comprises two or more magnetic iron oxides with different coercive forces,
   the two or more magnetic iron oxides with different coercive forces comprise two or more kinds of epsilon iron oxides in which part of Fe sites of the epsilon iron oxide crystal is substituted with a trivalent metal element and that have a difference in an electromagnetic-wave absorption frequency of 5 GHz or more from each other, or comprise one or more kinds of epsilon iron oxides in which part of Fe sites of the epsilon iron oxide crystal is substituted with a trivalent metal element and one or more kinds of strontium ferrites, and
   the electromagnetic-wave absorber composition has two or more extrema separated from each other on a differential curve obtained by differentiating a magnetic property hysteresis loop at an applied magnetic field intensity of from 16 kOe to −16 kOe.

2. The electromagnetic-wave absorber composition according to claim 1, wherein a coercive force of the magnetic iron oxide is 1200 Oe or more.

3. The electromagnetic-wave absorber composition according to claim 1, wherein the magnetic iron oxide comprises at least one of epsilon iron oxide, M-type ferrite, and strontium ferrite.

4. The electromagnetic-wave absorber composition according to claim 1, wherein the magnetic iron oxide comprises at least two of epsilon iron oxide, M-type ferrite, and strontium ferrite.

5. An electromagnetic-wave absorber comprising an electromagnetic-wave absorbing layer formed of the electromagnetic-wave absorber composition according to claim 1.

6. The electromagnetic-wave absorber according to claim 5, further comprising an adhesive layer.

7. The electromagnetic-wave absorber according to claim 5, wherein the electromagnetic-wave absorbing layer is an electromagnetic-wave absorbing sheet formed in a sheet shape.

* * * * *